(12) United States Patent
Yamazaki

(10) Patent No.: US 9,595,416 B2
(45) Date of Patent: Mar. 14, 2017

(54) TRANSMISSION ELECTRON MICROSCOPE

(71) Applicant: JEOL Ltd., Tokyo (JP)

(72) Inventor: Kazuya Yamazaki, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 14/630,922

(22) Filed: Feb. 25, 2015

(65) Prior Publication Data
US 2015/0311029 A1    Oct. 29, 2015

(30) Foreign Application Priority Data
Feb. 28, 2014   (JP) .................................. 2014-38089

(51) Int. Cl.
*H01J 37/14*    (2006.01)
*H01J 37/141*   (2006.01)
*H01J 37/26*    (2006.01)

(52) U.S. Cl.
CPC ............ *H01J 37/141* (2013.01); *H01J 37/26* (2013.01)

(58) Field of Classification Search
CPC .. H01J 37/10; H01J 37/12; H01J 37/14; H01J 37/141; H01J 37/143; H01J 37/145; H01J 37/26; H01J 37/29; H01J 37/2955
See application file for complete search history.

(56) References Cited

U.S. PATENT DOCUMENTS

| 5,442,182 A | * | 8/1995 | Kubo | .................. H01J 37/141 |
| | | | | 250/396 ML |
| 8,772,714 B2 | * | 7/2014 | Yamazaki | ............... H01J 37/26 |
| | | | | 250/311 |

FOREIGN PATENT DOCUMENTS

| JP | 200532588 A | 2/2005 |
| JP | 2005032588 A * | 2/2005 |

* cited by examiner

*Primary Examiner* — David E Smith
(74) *Attorney, Agent, or Firm* — The Webb Law Firm

(57) ABSTRACT

A transmission electron microscope (100) capable of reducing the effects of stray magnetic fields includes an electron beam source (2), an illumination lens system (4) for causing the electron beam to impinge on a sample (S), a sample stage (6) for holding the sample (S), a first objective lens (8), a second objective lens (10) disposed behind the first objective lens (8), an imaging lens system (16) disposed behind the second objective lens (10), and a controller (22) configured or programmed for controlling the first objective lens (8) and the second objective lens (10). The first objective lens (8) has upper and lower polepieces disposed on opposite sides of the sample (S). The upper and lower polepieces together produce a magnetic field. The controller (22) performs an operation for controlling the second objective lens (10) to construct a TEM (transmission electron microscope) image of the sample (S) out of the electron beam transmitted through the sample (S). Furthermore, the controller performs an operation for controlling the first objective lens (8) according to imaging conditions to produce a magnetic field that cancels out stray magnetic fields at the position where the sample (S) is placed.

5 Claims, 9 Drawing Sheets

TRANSMISSION ELECTRON MICROSCOPE

BACKGROUND OF THE INVENTION

Field of the Invention

The present invention relates to a transmission electron microscope.

Description of Related Art

In a transmission electron microscope, an objective lens is used as a lens for focusing and imaging an electron beam. A magnetic objective lens assembly is disclosed as one type of such an objective lens, for example, JP-A-2005-32588.

However, where a magnetic sample that is susceptible to the effects of a magnetic field is observed with a transmission electron microscope, there is the problem that the magnetic properties of the sample are affected by the magnetic field of the objective lens. That is, when a sample susceptible to the effects of a magnetic field is placed under the influence of the magnetic field produced by an objective lens, the intrinsic state of the sample may not be observed.

Therefore, the objective lens assembly forth in JP-A-2005-32588 has a first magnetic lens and a second magnetic lens for producing magnetic fields near a sample placement region which extends along the optical axis and in which a sample is to be placed. The objective lens assembly is so configured that, in the sample placement region, the magnetic fields produced by the first and second magnetic lenses, respectively, cancel out to zero.

In an electron microscope, electron lenses made of a ferromagnetic substance such as iron are used. An optical system for the microscope is constituted by stacking such electron lenses on top of each other. Accordingly, a magnetic circuit is formed over the whole electron microscope. Therefore, it follows that the effects of magnetic fields arising from other than the objective lens reach the surroundings of the sample. For this reason, if the magnetic fields produced by the first and second magnetic lenses of the objective lens assembly set forth in JP-A-2005-32588 cancel out to zero, the effects of magnetic fields produced other than from the objective lens assembly reach the surroundings of the sample.

For example, during observation using an electron microscope, the excitation of the imaging lens system is varied such as a variation in the magnification. This in turn varies the magnetic field. The effects of this variation may reach the surroundings of the sample via the magnetic circuit.

It is estimated that the magnitude of the effects of magnetic fields produced from other than the objective lens assembly, i.e., the magnitude of the effects of stray magnetic fields at the position of the sample, is on the order of hundreds of μT (microteslas). If there is a weak magnetic field on the order of hundreds of μT in this way, and if a material with high magnetic permeability ($\chi$ is approximately $10^6$) is used, the problem cannot be neglected. If the magnetic field is as weak as hundreds of μT, displacement of magnetic domains or variations in the morphology of magnetic domains may occur in a magnetic substance with high magnetic permeability. The principal purpose of analysis of a magnetic substance is morphological observation of a magnetic domain distribution inside the magnetic substance. To permit this observation, surrounding magnetic fields need to be made as low as possible. Also, movement of magnetic domains and morphological variations in the magnetic domains should be avoided.

SUMMARY OF THE INVENTION

In view of the foregoing problem, the present invention has been made. One object associated with some aspects of the present invention is to offer a transmission electron microscope capable of reducing the effects of stray magnetic fields.

(1) A transmission electron microscope associated with the present invention has: an electron beam source producing an electron beam; an illumination lens system for causing the electron beam from the electron beam source to impinge on a sample; a sample stage for holding the sample thereon; a first objective lens having an upper polepiece and a lower polepiece located on opposite sides of the sample, the upper and lower polepieces cooperating to produce a magnetic field; a second objective lens disposed behind the first objective lens; an imaging lens system disposed behind the second objective lens; and a controller for controlling the first and second objective lenses. The controller performs an operation for controlling the second objective lens to construct a transmission electron microscope image of the sample from the electron beam transmitted through the sample. The controller further performs an operation for controlling the first objective lens according to imaging conditions to produce a magnetic field that cancels out stray magnetic fields at a position where the sample is placed.

In this transmission electron microscope, the second objective lens focuses the transmission electron microscope image. The first objective lens produces the magnetic field that reduces the stray magnetic fields. Consequently, the effects of the stray magnetic fields can be reduced. With this transmission electron microscope, therefore, a sample susceptible to the effects of a magnetic field produced by a magnetic substance can be observed without varying the state of the sample.

(2) In one feature of this transmission electron microscope, during the operation for producing a magnetic field that cancels out the stray magnetic fields, the excitation current of the first objective lens may be found, using a function indicating a relation between the excitation current of the imaging lens system and the excitation current of the first objective lens for canceling out the stray magnetic fields.

In this transmission electron microscope, even if the amount of stray magnetic fields at the position of the sample is varied, for example, concomitantly with a variation of the excitation current (such as the final magnification) of the imaging lens system, a magnetic field that cancels out the stray magnetic fields can be produced by the first objective lens according to the variation in the amount of the stray magnetic fields.

(3) In a further feature of this transmission electron microscope, during the operation for producing a magnetic field that cancels out the stray magnetic fields, the excitation current of the first objective lens may be found, using a function indicating a relation between the excitation current of the second objective lens and the excitation current of the first objective lens for canceling out the stray magnetic fields.

In this transmission electron microscope, even if the amount of stray magnetic fields at the position of the sample is varied, for example, concomitantly with a variation in the excitation current of the second objective lens (such as a focus value), a magnetic field that cancels out the stray magnetic fields can be produced by the first objective lens according to the variation in the amount of stray magnetic fields.

(4) In a still other feature of this transmission electron microscope, during the operation for producing a magnetic field that cancels out the stray magnetic fields, the excitation current of the first objective lens may be found, using a function indicating a relation between the excitation current of the illumination lens system and the excitation current of the first objective lens for canceling out the stray magnetic fields.

In this transmission electron microscope, if the excitation current of the illumination lens system is varied to thereby vary the amount of the stray magnetic fields at the position of the sample, it is possible to cause the first objective lens to produce a magnetic field that cancels out the stray magnetic fields according to variations in the amount of stray magnetic fields.

(5) In an additional feature of this transmission electron microscope, there is further provided a magnetic field sensor for detecting external magnetic fields. The controller may perform an operation for controlling the first objective lens on the basis of results of a detection performed by the magnetic field sensor to produce a magnetic field that cancels out the stray magnetic fields.

In this transmission electron microscope, the effects of stray magnetic fields (i.e., external magnetic fields) at the position of the sample can be reduced.

(6) In one feature of this transmission electron microscope, the controller may find the excitation current of the first objective lens, using a function indicating a relation between the amount of the external magnetic fields and the excitation current of the first objective lens for canceling out the stray magnetic fields.

In this transmission electron microscope, if the amount of the external magnetic fields varies to thereby vary the amount of stray magnetic fields at the position of the sample, it is possible to cause the first objective lens to produce a magnetic field that cancels out the stray magnetic fields.

(7) In a further feature of this transmission electron microscope, the microscope may further include a polarity inverter for controlling the polarity of the first objective lens.

In this transmission electron microscope, the polarity of the first objective lens can be reversed. Thus, in this microscope, the direction of the magnetic field produced by the first objective lens can be controlled.

(8) In an additional feature of this transmission electron microscope, the controller may perform an operation for controlling the first objective lens to apply a given magnetic field to the position where the sample is placed.

In this transmission electron microscope, a desired magnetic field can be applied to the sample. This microscope permits one to observe a magnetic sample while applying a desired magnetic field to the sample.

(9) In a still other feature of this transmission electron microscope, the operation for applying a given magnetic field to the position where the sample is placed may be performed after the operation for producing a magnetic field that cancels out the stray magnetic fields.

In this transmission electron microscope, a desired magnetic field can be applied to the sample while reducing the effects of stray magnetic fields.

(10) In a yet additional feature of this transmission electron microscope, there may be further provided a magnetic eraser for supplying a given current to the first objective lens to erase a residual magnetic field in the first objective lens.

In this transmission electron microscope, the effects of the residual magnetic field in the first objective lens can be reduced.

(11) In a further additional feature of this transmission electron microscope, there may be further provided: a scanning signal generator for generating a scanning signal; and scan coils for scanning the electron beam over the sample on the basis of the scanning signal.

This transmission electron microscope can obtain scanning transmission electron microscope images.

DESCRIPTION OF THE INVENTION

The preferred embodiments of the present invention are hereinafter described in detail with reference to the drawings. It is to be understood that the embodiments provided below do not unduly restrict the scope and content of the present invention delineated by the appended claims and that not all the configurations described below are essential constituent components of the invention.

1. First Embodiment 1.1. Transmission Electron Microscope

Figure 1:
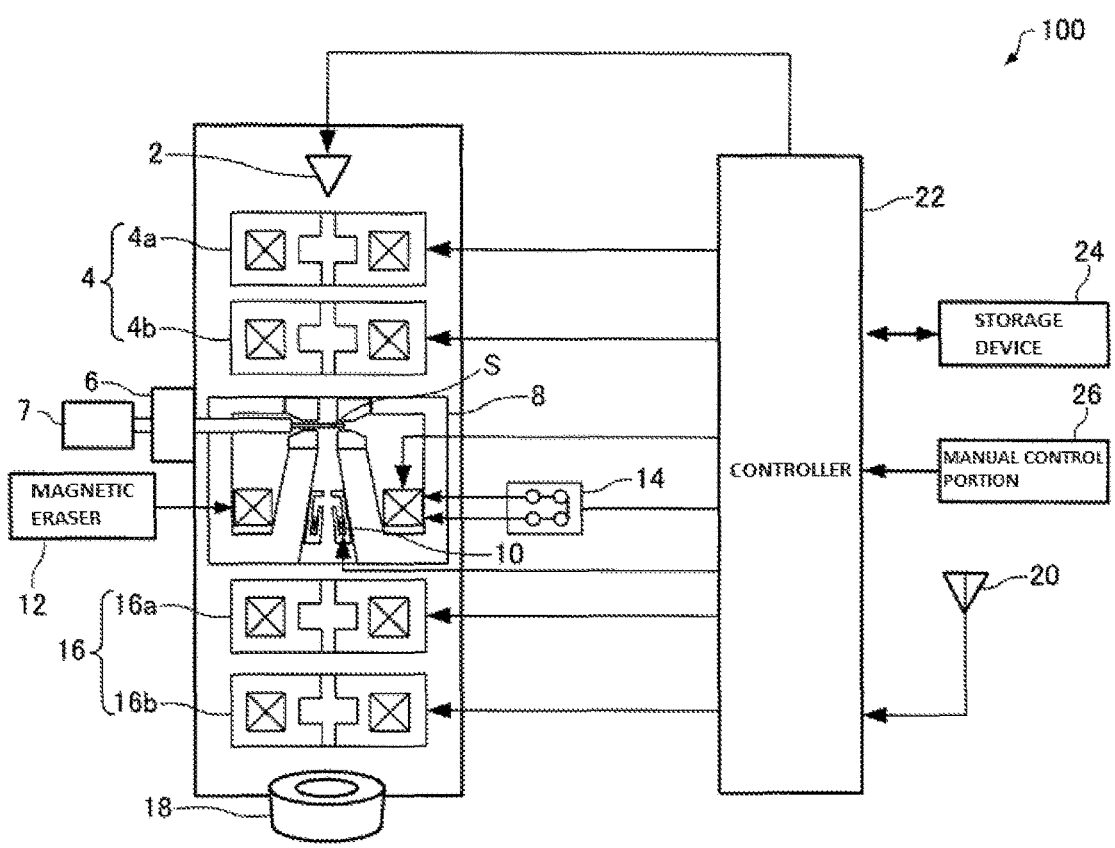
FIG. 1 is a schematic view, partly in block form, of a transmission electron microscope associated with a first embodiment of the present invention, showing the configuration of the microscope.

First, the configuration of a transmission electron microscope, 100, associated with a first embodiment of the present invention is described by referring to FIG. 1, which schematically shows the configuration of the microscope 100. As shown in FIG. 1, the transmission electron microscope 100 includes an electron beam source 2, an illumination lens system 4, a sample stage 6, a first objective lens 8, a second objective lens 10, a magnetic eraser 12, a polarity inverter 14, an imaging lens system 16, a detector 18, a magnetic field sensor 20, a controller 22, a storage device 24, and a manual control portion 26.

The transmission electron microscope 100 is an instrument for obtaining transmission electron microscope (TEM) images by transmission electron microscopy. A TEM image is a diffraction pattern or a real space image derived either by transmission electron microscopy or by scanning transmission electron microscopy. Real space images include bright-field images and dark-field images. A bright-field image is produced by causing electrons to pass through a sample S and detecting electrons which have passed through the sample S without being scattered and electrons scattered at small angles. A dark-field image is produced by causing electrons to pass through the sample S and detecting the electrons scattered or diffracted by the sample S.

The electron beam source 2 emits an electron beam by accelerating electrons, which are released from a cathode, by means of an anode. An electron gun can be used as the electron beam source 2. No restriction is imposed on the electron gun used as the electron beam source 2. A thermionic electron gun, a thermal field emission electron gun, a cold field emission gun, or other electron gun can be used.

The illumination lens system 4 is disposed behind (on the downstream side relative to the direction of the electron beam) the electron beam source 2. The illumination lens system 4 focuses the electron beam generated by the electron beam source 2 onto the sample S. The illumination lens system 4 includes a first condenser lens 4a and a second condenser lens 4b, the lens 4b being a condenser minilens. In the illumination lens system 4, the crossover of the electron beam released from the electron beam source 2 is demagnified by the first condenser lens 4a. The demagnified beam image is transferred to the object plane of the first objective lens 8 by the second condenser lens 4b.

The sample stage 6 holds the sample S thereon. In the illustrated example, the sample stage 6 holds the sample S via a sample holder 7. That is, the sample stage 6 holds the sample holder 7 having a front end portion that holds the sample S. The sample stage 6 can place the sample S in position by moving and stopping the sample holder 7. Furthermore, the sample stage 6 can move the sample S in a horizontal direction (perpendicular to the electron beam) and in a vertical direction (direction along the electron beam). In addition, the sample stage 6 can tilt the sample S.

In the illustrated example, the sample stage 6 is a side-entry stage for inserting the sample S from a side of the polepieces of the first objective lens 8. Alternatively, the sample stage 6 may be a top-loading stage (not shown) for inserting the sample S from above the polepieces of the first objective lens 8. The first objective lens 8 is disposed behind the illumination lens system 4. The second objective lens 10 is disposed behind the first objective lens 8.

Figure 2:
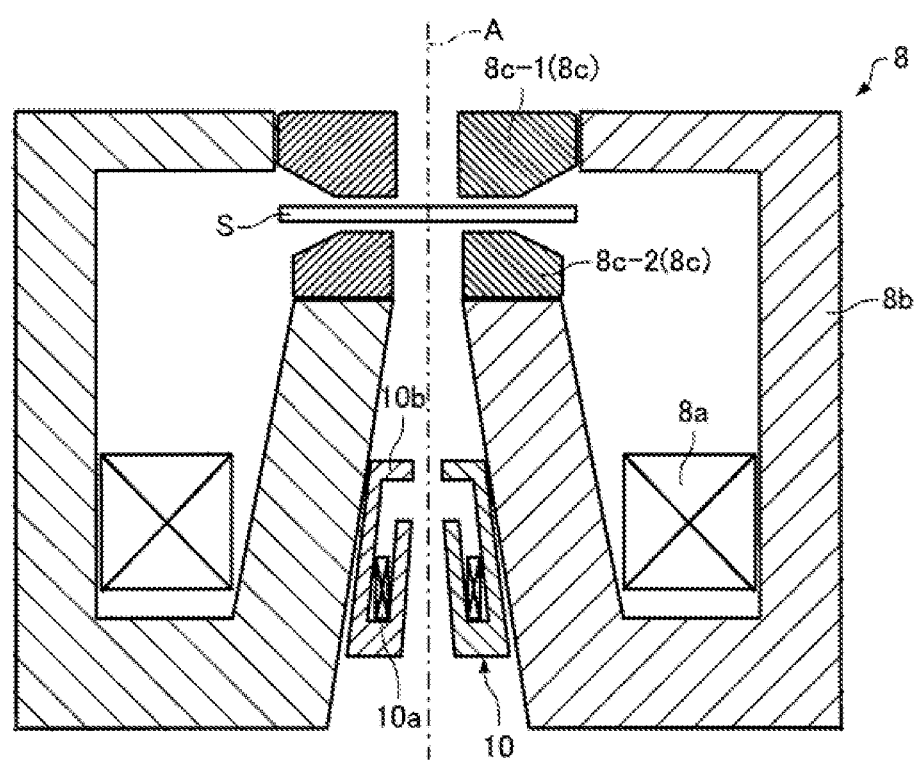
FIG. 2 is a schematic cross-sectional view of first and second objective lenses of the microscope shown in FIG. 1.

FIG. 2 is a schematic cross-sectional view of the first objective lens 8 and second objective lens 10 of the transmission electron microscope 100. In FIG. 2, for the sake of convenience, the sample holder 7 is omitted from being shown. As shown in FIG. 2, the first objective lens 8 is configured including a coil 8a, a yoke 8b, and a polepiece assembly 8c. Magnetic flux generated by exciting the coil 8a of the first objective lens 8 is made to leak from the polepiece assembly 8c into the outside space through the yoke 8b. The polepiece assembly 8c consists of an upper polepiece 8c-1 and a lower polepiece 8c-2 between which a magnetic field of strong rotational symmetry is produced, whereby the electron beam can be focused. The yoke 8b and the polepiece assembly 8c may be formed integrally.

As shown in FIG. 2, the sample S is placed between the upper polepiece 8c-1 and the lower polepiece 8c-2 of the polepiece assembly 8c. Therefore, when the first objective lens 8 is operated, a strong magnetic field is applied to the sample S, which is held between the upper polepiece 8c-1 and the lower polepiece 8c-2 of the polepiece assembly 8c by the sample stage 6 via the sample holder 7.

As shown also in FIG. 2, the second objective lens 10 is configured including a coil 10a and a yoke 10b. That is, the second objective lens 10 does not have any polepiece for intensifying a magnetic field. The second objective lens 10 is separate from the yoke 8b of the first objective lens 8b and operates independently of the first objective lens 8. The second objective lens 10 does not have any polepiece for intensifying a magnetic field. The second objective lens 10 is independent of the first objective lens 8 and disposed remotely from the sample S. For example, the second objective lens 10 is spaced tens of millimeters from the first objective lens 8. Therefore, when the second objective lens 10 is operated, the effects of the magnetic field on the sample S are much smaller than where the first objective lens 8 is operated.

The magnetic eraser 12 (FIG. 1) supplies a given current to the coil 8a of the first objective lens 8 to demagnetize the residual magnetic field (i.e., magnetic field remaining in the first objective lens 8 if the excitation of the first objective lens 8 is reduced to zero) in the first objective lens 8. The magnetic eraser 12 performs the demagnetization, for example, by supplying an AC current of a given frequency, whose amplitude attenuates with time and finally converges to 0 A, to the coil 8a of the first objective lens 8. The magnetic eraser 12 can be implemented, for example, by a dedicated circuit.

The polarity inverter 14 controls the polarity of the first objective lens 8. The polarity inverter 14 can reverse the polarity of the first objective lens 8 by reversing the polarity (sense) of the current supplied to the coil 8a of the first objective lens 8. The polarity inverter 14 can be implemented, for example, by a dedicated circuit.

The imaging lens system 16 (FIG. 1) is located behind the second objective lens 10. The imaging lens system 16 includes an intermediate lens 16a and a projector lens 16b. The imaging lens system 16 is operative to further magnify the image focused by the first objective lens 8 and second objective lens 10 and to focus the further magnified image onto the detector 18.

The detector 18 captures the TEM image focused by the imaging lens system 16. For example, the detector 18 is a digital camera and outputs information about the captured TEM image. The image information output by the detector 18 is processed by an image processor (not shown) and displayed on the display device (not shown). The display device is a CRT, LCD, touch panel display, or the like.

The magnetic field sensor 20 is used to detect external magnetic fields. External magnetic fields including terrestrial magnetism and magnetic fields generated by other instruments and devices are present around the transmission electron microscope 100. The controller 22 is configured or programmed to control the various components with routines as described below. The magnetic field sensor 20 detects the external magnetic fields and outputs information about the amount of the detected magnetic field to the controller 22. The controller 22 controls the first objective lens 8 and the second objective lens 10. Furthermore, the controller 22 controls the electron beam source 2, illumination lens system 4, and imaging lens system 16.

The transmission electron microscope 100 has a first imaging mode in which electrons transmitted through the sample S are imaged by the first objective lens 8 and a second imaging mode in which electrons transmitted through the sample S are imaged by the second objective lens 10.

In the first imaging mode, the controller 22 controls the illumination lens system 4 such that the electron beam falls on the sample S. The controller 22 controls the first objective lens 8 such that a TEM image of the sample S is formed. The controller 22 controls the imaging lens system 16 such that the TEM image of the sample S focused by the first objective lens 8 is focused onto the detector 18. In the first imaging mode, imaging using the first objective lens 8 can be performed. Therefore, in the first imaging mode, a sample can be imaged and observed while less affected by magnetic fields.

In the second imaging mode, the controller 22 controls the illumination lens system 4 such that the electron beam impinges on the sample S. The controller 22 controls the second objective lens 10 such that a TEM image of the sample S is constructed from the electron beam transmitted through the sample S. The controller controls the imaging lens system 16 such that the TEM image of the sample S created by the second objective lens 10 is focused onto the detector 18.

Furthermore, in the second imaging mode, the controller 22 controls the first objective lens 8 according to imaging conditions to produce a magnetic field that cancels out stray magnetic fields at the position where the sample S is placed. These stray magnetic fields reach the position of the sample through the magnetic circuit formed over the whole transmission electron microscope 100 after being produced from the second objective lens 10, imaging lens system 16, and illumination lens system 4. The stray magnetic fields contain external magnetic fields. The imaging conditions include a final magnification and a focus value, for example. In the second imaging mode, the final magnification is determined by the excitation current of the imaging lens system 16. The focus value is determined by the excitation current of the second objective lens 10. In this way, the imaging conditions are determined by the excitation current of the second objective lens 10, the excitation current of the imaging lens system 16, the excitation current of the illumination lens system 4, and so on.

An operation for controlling the first objective lens 8 according to the imaging conditions to produce a magnetic field that cancels out the stray magnetic fields at the position where the sample S is placed is described below. A case in which the excitation current of the imaging lens system 16 is varied is first described. When the excitation current of the imaging lens system 16 is varied (e.g., when the final magnification is varied), the controller 22 determines the excitation current of the first objective lens 8 using a function indicating a relation between the excitation current (e.g., a final magnification) of the imaging lens system 16 and the excitation current of the first objective lens 8 for canceling out the stray magnetic fields at the position of the sample. This function can be found, for example, by measuring the amount of stray magnetic field B(i) at the sample position for each value of the final magnification M(i), the excitation current O(i) of the first objective lens 8 for canceling out the amount of stray magnetic fields B(i) at the sample position for each value of the final magnification M(i), and the polarity P(i) of the first objective lens 8.

The controller 22 finds the excitation current of the first objective lens 8, for example, from the final magnification, using a function indicating a relation between the final magnification (the excitation current of the imaging lens system 16) and the excitation current of the first objective lens 8 for canceling out the stray magnetic fields at the sample position. The controller 22 supplies an excitation current corresponding to the calculated excitation current of the first objective lens 8 to the coil 8a of the first objective lens 8, based on the obtained excitation current of the first objective lens 8. Furthermore, the controller 22 controls the polarity inverter 14 based on the obtained polarity of the first objective lens 8 to achieve a polarity corresponding to the calculated polarity.

These measurements make it possible to find a function indicating a relation among the amount of stray magnetic fields at the sample position, the excitation current of the first objective lens 8 for canceling out the amount of stray magnetic fields B, and the polarity. Using this function, it is possible to find a function indicating a relation between the excitation current of the second objective lens 10 (a focus value) and the excitation current of the first objective lens 8 for canceling out the stray magnetic fields at the sample position, a function indicating a relation between the excitation current of the illumination lens system 4 and the excitation current of the first objective lens 8 for canceling out the stray magnetic fields at the sample position, and a function indicating a relation between the amount of external fields and the excitation current of the first objective lens 8 for canceling out the stray magnetic fields at the sample position as described later.

A case in which the excitation current of the second objective lens is modified is next described. When the excitation current of the second objective lens 10 is varied (e.g., when the focus value is varied), the controller 22 determines the excitation current of the first objective lens 8, using the function indicating a relation between the excitation current of the second objective lens 10 (the focus value) and the excitation current of the first objective lens 8 for canceling out the stray magnetic fields at the sample position.

The function indicating the relation between the excitation current of the second objective lens 10 and the excitation current of the first objective lens 8 for canceling out the stray magnetic fields at the sample position can be obtained from both an equation indicating a relation between the excitation current of the second objective lens 10 and the stray magnetic fields at the sample position and the function indicating the relation among the amount of stray magnetic fields at the sample position, the excitation current of the first objective lens 8 for canceling out the amount of stray magnetic fields, and the polarity.

The relation between the excitation current of the second objective lens 10 and the amount of stray magnetic fields at the sample position can be found, for example, by measurements. In particular, the excitation current, SO, of the second objective lens 10 is set to a given value, and the amount of stray magnetic fields B (SO) is measured. This measurement is repeated a plurality of times while varying the excitation current SO of the second objective lens 10. Coefficients a and b of the equation given in the following and indicating a relation between the excitation current SO of the second objective lens 10 and the amount of stray magnetic fields B (SO) at the sample position are found from the results of the measurements.

$$B(SO)=a \times SO+b \tag{1}$$

Consequently, Eq. (1) indicating a relation between the excitation current of the second objective lens 10 and the stray magnetic fields at the sample position can be found.

The controller 22 calculates the amount of stray magnetic fields from the excitation current of the second objective lens 10, for example, using Eq. (1) and finds the excitation current of the first objective lens 8 and the polarity from the calculated amount of stray magnetic fields using the function indicating the relation among the amount of stray magnetic fields at the sample position, the excitation current of the first objective lens 8 for canceling out the stray magnetic fields, and the polarity. Then, the controller 22 supplies an excitation current to the coil 8a of the first objective lens 8 in response to the obtained excitation current of the first objective lens 8, the excitation current corresponding to the calculated excitation current of the first objective lens 8. Furthermore, the controller 22 controls the polarity inverter 14 based on the obtained polarity of the first objective lens 8 to achieve a polarity corresponding to the calculated polarity.

A case in which the excitation current of the illumination lens system 4 is modified is next described. When the excitation current of the illumination lens system 4 is modified, the controller 22 determines the excitation current of the first objective lens 8 using the function indicating the relation between the excitation current of the illumination lens system 4 and the excitation current of the first objective lens 8 for canceling out the stray magnetic fields at the sample position. This function can be obtained from the equation indicating the relation between the excitation current of the illumination lens system 4 and the stray magnetic fields at the sample position and from the function indicating the relation among the amount of stray magnetic fields at the sample position, the excitation current of the first objective lens 8 for canceling out the amount of stray magnetic fields, and the polarity.

The relation between the excitation current of the illumination lens system 4 and the amount of stray magnetic fields at the sample position can be found, for example, by measurements. In particular, the excitation current IL of the illumination lens system 4 is set to a given value. The amount of stray magnetic fields B (IL) is measured. This measurement is repeated a plurality of times while varying the excitation current IL of the illumination lens system 4. Coefficients c and d of an equation given in the following and indicating a relation between the excitation current IL of the illumination lens system 4 and the amount of stray magnetic fields B (IL) at the sample position are found from the results of the measurements.

$$B(IL) = c \times IL + d \quad (2)$$

The controller 22 calculates an amount of stray magnetic fields from the excitation current of the illumination lens system 4, for example, using Eq. (2) and finds the excitation current of the first objective lens 8 and the polarity from the calculated amount of stray magnetic fields using the function indicating the relation among the amount of stray magnetic fields at the sample position, the excitation current of the first objective lens 8 for canceling out the amount of stray magnetic fields, and the polarity. Then, the controller 22 supplies an excitation current corresponding to the calculated excitation current of the first objective lens 8 to the coil 8a of the first objective lens 8, based on the obtained excitation current of the first objective lens 8. Furthermore, the controller 22 controls the polarity inverter 14 based on the obtained polarity of the first objective lens 8 to achieve a polarity corresponding to the obtained polarity.

In the second imaging mode, the controller 22 performs an operation for controlling the first objective lens 8 based on the result of the detection made by the magnetic field sensor 20 to produce a magnetic field that cancels out the stray magnetic fields. In particular, the controller 22 determines the excitation current of the first objective lens 8 using a function indicating a relation between the amount of external magnetic fields and the excitation current of the first objective lens 8 for canceling out the stray magnetic fields at the sample position.

The function indicating the relation between the amount of external magnetic fields and the excitation current of the first objective lens 8 for canceling out the stray magnetic fields at the sample position can be obtained from both an equation indicating a relation between the amount of external magnetic fields and the stray magnetic fields at the sample position and a function indicating the relation among the amount of stray magnetic fields at the sample position, the excitation current of the first objective lens 8 for canceling out the amount of stray magnetic fields, and the polarity.

The relation between the amount of magnetic fields and stray magnetic fields at the sample position can be found, for example, by measurements. In particular, the amount of external magnetic field Bex being a reading taken from the magnetic field sensor 20 is set to a given value. The amount of stray magnetic fields B (denoted by Bex) is measured. This measurement is repeated a plurality of times while varying the amount of external magnetic fields Bex. Coefficients e and f of an equation given in the following and indicating a relation between the amount of external magnetic fields Bex and the amount of stray magnetic fields B (Bex) at the sample position are found from the results of the measurements.

$$B(Bex) = e \times Bex + f \quad (3)$$

The controller 22 calculates the amount of stray magnetic fields from the amount of external magnetic fields, for example, using Eq. (3) and finds the excitation current of the first objective lens 8 and the polarity from the calculated amount of stray magnetic fields, using a function indicating a relation among the amount of stray magnetic fields at the sample position, the excitation current of the first objective lens 8 for canceling out the amount of stray magnetic fields, and the polarity. The controller 22 supplies an excitation current corresponding to the calculated excitation current of the first objective lens 8 to the coil 8a of the first objective lens 8. Furthermore, the controller 22 controls the polarity inverter 14 based on the obtained polarity of the first objective lens 8 such that a polarity corresponding to the calculated polarity is achieved.

In the second imaging mode, the controller 22 performs an operation for applying a given magnetic field to the sample position. Consequently, a desired magnetic field can be applied to the sample S. The controller 22 may be made of dedicated circuitry and perform the above-described processing and control operations. The controller 22 may operate as a computer and perform the above-described processing and various control operations by causing a CPU (central processing unit) to execute control programs stored in the storage device 24.

The storage device 24 operates as a working area for the controller 22. The function of the storage device can be implemented by a RAM or the like. Data which are set according to imaging conditions of the illumination lens system 4, first objective lens 8, second objective lens 10, and imaging lens system 16 are stored in the storage device 24. Further stored in the storage device 24 are a function indicating a relation between final magnifications and excitation currents of the first objective lens 8 for canceling out the stray magnetic fields at the sample position, a function indicating a relation between excitation currents of the second objective lens 10 and the excitation current of the first objective lens 8 for canceling out the stray magnetic fields at the sample position, and a function indicating a relation between the amount of external magnetic fields and the excitation current of the first objective lens 8 for canceling out the stray magnetic fields at the sample position.

The manual control portion 26 performs an operation for obtaining a control signal produced in response to a user's action or manipulation and sending the signal to the controller 22. The manual control portion 26 is made, for example, of buttons, keys, a touch panel display, a microphone, or the like.

1.2. Operation of Transmission Electron Microscope

The operation of the transmission electron microscope 100 associated with the first embodiment is next described.

1.2.1. Operation for Switching the Mode of Operation from First Imaging Mode to Second Imaging Mode An operation for switching the mode of operation from the first imaging mode to the second imaging mode is first described by referring to FIG. 3, which is a flowchart illustrating one example of subroutine performed by the transmission electron microscope 100 associated with the first embodiment when the mode of operation is switched as described above.

When the user operates the manual control portion 26 to switch the mode of operation to the second imaging mode, the manual control portion 26 sends a mode switching signal to the controller 22 to switch the mode to the second imaging mode. In response to this switching signal, the controller 22 turns off the first objective lens 8 (i.e., reduces the excitation current down to zero) (step S100). At this time, the final magnification is set to a prescribed value. The excitation current of the second objective lens 10 is set to a prescribed value. The prescribed values of the magnification and excitation current are arbitrary values.

Then, the magnetic eraser 12 supplies a given current to the coil 8a of the first objective lens 8 to erase the residual magnetic field in the first objective lens 8 (step S102). In the present step, the magnetic eraser 12 sets the amount of magnetic field at the sample position to 0 mT under conditions where the final magnification and the excitation current of the second objective lens 10 are their respective prescribed values.

Then, the user holds the sample S to the sample holder 7 and loads the holder 7 on the sample stage 6. The sample S is inserted between the upper polepiece 8c-1 and the lower polepiece 8c-2 of the first objective lens 8 (step S104).

The controller 22 then controls the illumination lens system 4 to cause the electron beam produced by the electron beam source 2 to hit the sample S (step S106). In particular, the controller 22 obtains data which have been set for the illumination lens system 4 and which are stored in the storage device 24, and supplies a given excitation current to the illumination lens system 4.

The controller 22 then controls the second objective lens 10 to bring the electron image from the sample S into focus at the object plane of the imaging lens system 16 (step S108). The controller 22 obtains the set data about the second objective lens 10 stored in the storage device 24 and supplies a given excitation current to the second objective lens 10. At this time, the excitation current of the second objective lens 10 varies and so the amount of stray magnetic fields at the sample position also varies.

Therefore, the controller 22 performs an operation for controlling the first objective lens 8 to produce a magnetic field that cancels out the stray magnetic fields at the sample position (steps S110 and S112). In particular, the controller 22 finds the excitation current of the first objective lens 8 from information about the excitation current of the second objective lens 10, using the function stored in the storage device 24 and indicating the relation between the excitation current of the second objective lens 10 and the excitation current of the first objective lens 8 for canceling out the stray magnetic fields at the sample position (step S110). Then, the controller 22 supplies an excitation current corresponding to the found excitation current of the first objective lens 8 to the coil 8a of the first objective lens 8 (step S112). Consequently, the first objective lens 8 produces a magnetic field that cancels out the stray magnetic fields. The controller 22 ends the present processing subroutine.

1.2.2. Operation Performed when Final Magnification is Modified

Figure 4:
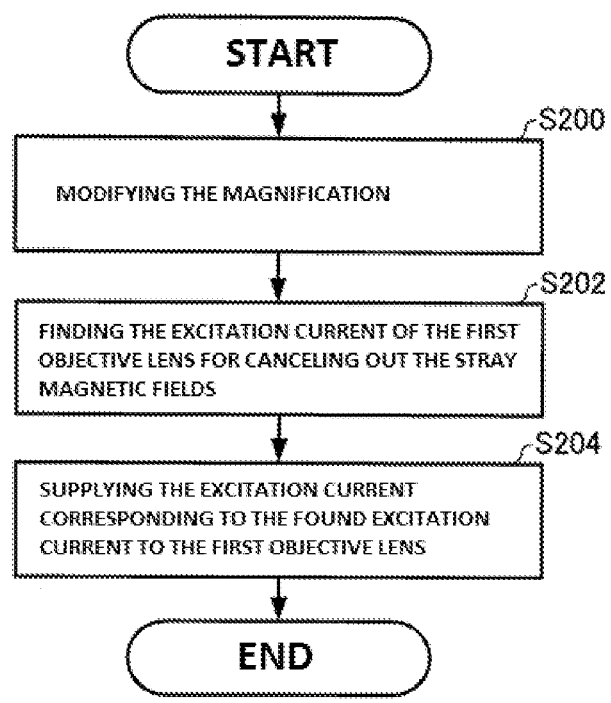
FIG. 4 is a flowchart illustrating one example of subroutine performed by the microscope shown in FIG. 1 when the final magnification is varied in the second imaging mode.

The operation of the transmission electron microscope 100 performed when the final magnification is modified in the second imaging mode is next described by referring to FIG. 4, which is a flowchart illustrating one example of subroutine performed by the microscope 100 when the final magnification is modified in the second imaging mode.

Figure 3:
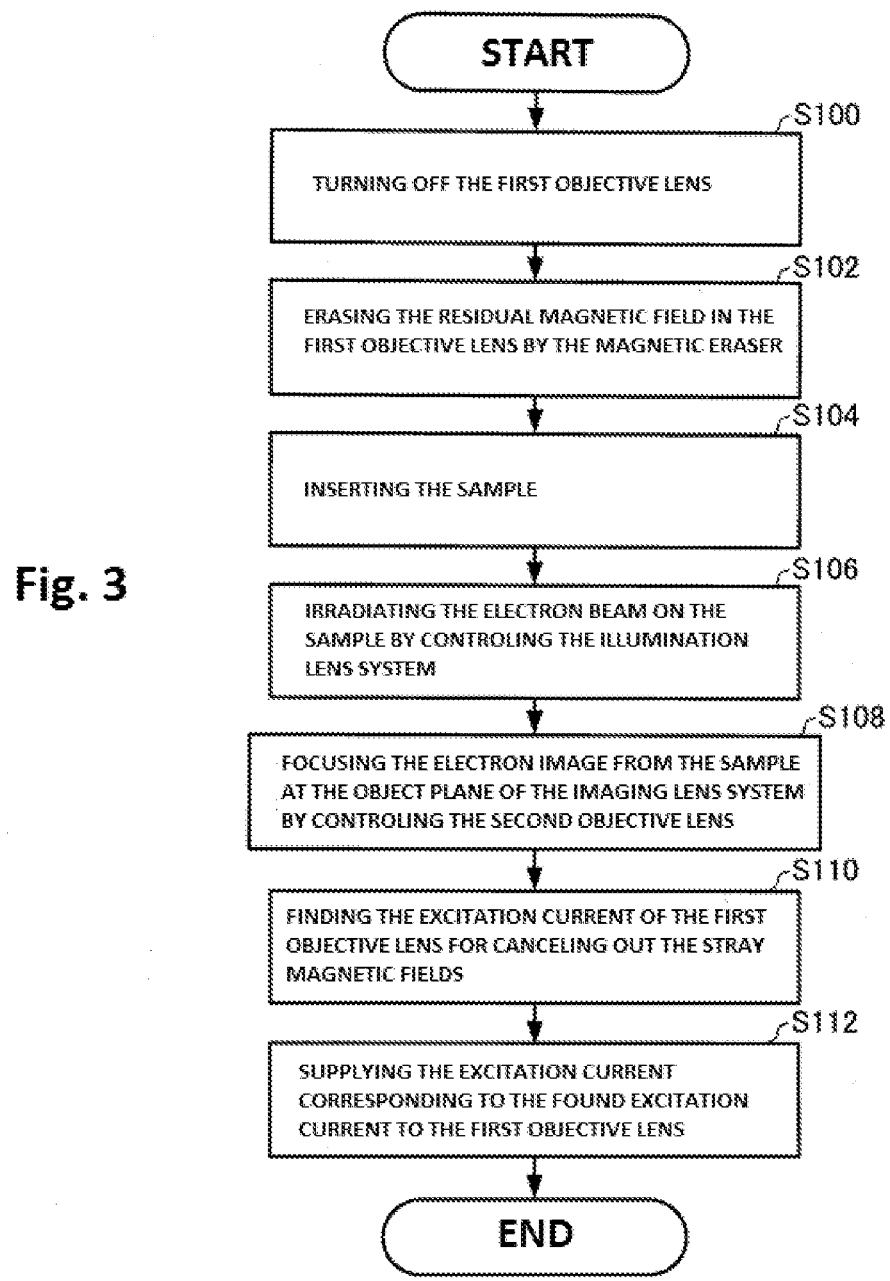
FIG. 3 is a flowchart illustrating one example of subroutine performed by the transmission electron microscope shown in FIG. 1 when the mode of operation is switched from a first imaging mode to a second imaging mode.

The steps S100-S112 illustrated in FIG. 3 are performed and the mode of operation is switched to the second imaging mode. Then, if the user manipulates the manual control portion 26 to enter a final magnification, the manual control portion 26 sends information about the final magnification to the controller 22. In consequence, the controller 22 initiates a processing subroutine.

In response to the information about the final magnification, the controller 22 performs an operation for modifying the final magnification (step S200). In particular, in response to information about the final magnification, the controller 22 obtains data which have been set for the imaging lens system 16 (including the intermediate lens 16a and projector lens 16b) and which are stored in the storage device 24 and modifies the excitation current of the imaging lens system 16 to a value corresponding to the final magnification. Concomitantly, the excitation current of the imaging lens system 16 varies. This varies the amount of stray magnetic fields at the sample position.

Therefore, the controller 22 performs an operation for controlling the first objective lens 8 to produce a magnetic field that cancels out the stray magnetic fields at the sample position (steps S202 and S204). In particular, in response to information about the final magnification from the manual control portion 26, the controller 22 determines the excitation current of the first objective lens 8 from the information about the final magnification, using a function stored in the storage device 24 and indicating a relation between final magnifications and excitation currents of the first objective lens 8 for canceling out stray magnetic fields at the sample position (step S202).

Then, the controller 22 supplies an excitation current corresponding to the calculated excitation current of the first objective lens 8 to the coil 8a of the first objective lens 8 (step S204). This causes the first objective lens 8 to produce a magnetic field that cancels out the stray magnetic fields. The controller 22 ends the present processing subroutine.

1.2.3. Operation Performed when Focus is Varied

Figure 5:
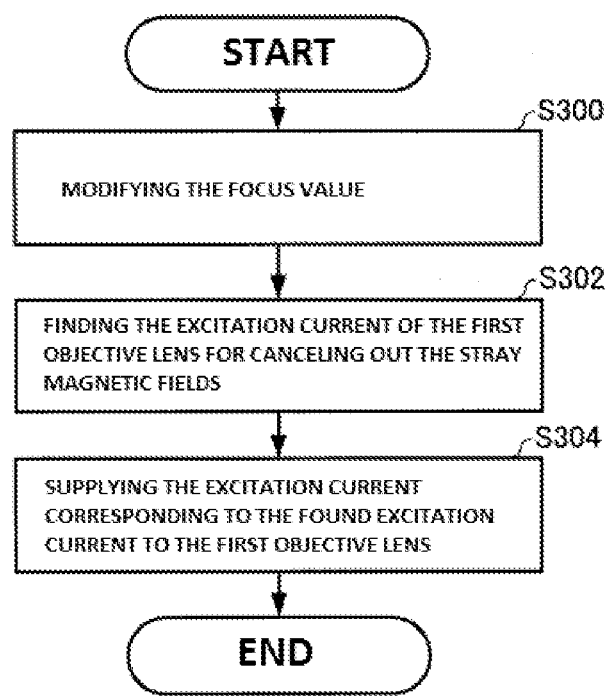
FIG. 5 is a flowchart illustrating one example of subroutine performed by the microscope shown in FIG. 1 when the focus is varied in the second imaging mode.

The operation of the transmission electron microscope 100 when the focus is varied in the second imaging mode is next described by referring to FIG. 5, which is a flowchart illustrating one example of subroutine performed by the microscope 100 when the focus is varied in the second imaging mode.

The steps S100-S112 illustrated in FIG. 3 are performed. The mode of operation is switched to the second imaging mode. Then, if the user manipulates the manual control portion 26 to modify the focus value, the manual control portion 26 sends information about the focus value to the controller 22, causing the controller 22 to initiate the processing routine.

First, in response to information about the focus value, the controller 22 performs an operation for modifying the focus value (step S300). In particular, in response to information about the focus value, the controller 22 obtains data which have been set for the second objective lens 10 and which are stored in the storage device 24 and modifies the excitation current of the second objective lens 10 to a current corresponding to the focus value. This results in a variation in the excitation current of the second objective lens 10. Consequently, the amount of stray magnetic fields at the sample position also varies.

Thus, the controller 22 performs an operation for controlling the first objective lens 8 to produce a magnetic field that cancels out the stray magnetic fields at the sample position (steps S302 and S304). In particular, in response to information about the focus value from the manual control portion 26 (i.e., information about the excitation current of the second objective lens 10), the controller 22 finds the excitation current of the first objective lens 8 from the information about the excitation current of the second objective lens 10, using a function stored in the storage device. 24 and indicating a relation between the excitation current of the second objective lens 10 and the excitation current of the first objective lens 8 for canceling out the stray magnetic fields at the sample position (step S302).

Then, the controller 22 supplies an excitation current corresponding to the calculated excitation current of the first objective lens 8 to the coil 8a of the first objective lens 8 (step S304). This causes the first objective lens 8 to produce a magnetic field that cancels out the stray magnetic fields. The controller 22 ends the present processing routine.

When the operation for modifying the focus (set forth under heading "1.2.3.") is performed after the operation for modifying final modification (set forth under heading "1.2.2."), the excitation current of the first objective lens 8 is the sum of the excitation current of the first objective lens 8 found by the operation performed when the final magnification is modified (set forth under heading "1.2.2.") and the excitation current of the first objective lens 8 found in the operation performed when the focus is modified (set forth under heading "1.2.3.").

1.2.4. Operation Performed when External Magnetic Fields are Detected

Figure 6:
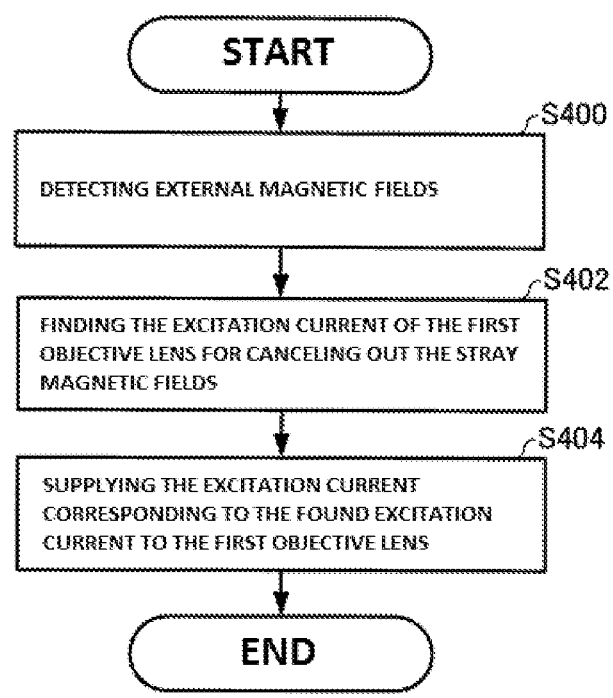
FIG. 6 is a flowchart illustrating one example of subroutine performed by the microscope shown in FIG. 1 when external magnetic fields are detected in the second imaging mode.

The operation of the transmission electron microscope 100 performed when the magnetic field sensor 20 detects external magnetic fields in the second imaging mode is next described by referring to FIG. 6, which is a flowchart illustrating one example of subroutine performed by the microscope 100 when external magnetic fields are detected in the second imaging mode.

The steps S100-S112 illustrated in FIG. 3 are performed. The mode of operation is switched to the second imaging mode. Then, if the magnetic field sensor 20 detects external magnetic fields (step S400), the sensor 20 sends information about the amount of the external magnetic fields to the controller 22.

In response to information about the amount of magnetic fields from the magnetic field sensor 20, the controller 22 performs an operation for controlling the first objective lens 8 to produce a magnetic field that cancels out the stray magnetic fields at the sample position (steps S402 and S404).

In particular, the controller 22 receives the information about the amount of external magnetic fields from the magnetic field sensor 20 and finds an excitation current of the first objective lens 8 from the information about the amount of the external magnetic fields, using a function stored in the storage device 24 and indicating the relation between amounts of external magnetic fields and excitation currents of the first objective lens 8 for canceling out stray magnetic fields at the sample position (step S402).

Then, the controller 22 supplies an excitation current corresponding to the calculated excitation current of the first objective lens 8 to the coil 8a of the first objective lens 8 (step S404). This causes the first objective lens 8 to produce a magnetic field that cancels out the stray magnetic fields. The controller 22 terminates the processing subroutine.

1.2.5. Operation for Applying Desired Magnetic Field to Sample

The operation of the transmission electron microscope 100 performed when a desired magnetic field is applied to the sample S in the second imaging mode is next described. The steps S100-S112 illustrated in FIG. 3 are performed. The mode of operation is switched to the second imaging mode. Then, if the user manipulates the manual control portion 26 to enter an amount of magnetic field and a polarity desirable for the sample S, the controller 22 performs an operation for controlling the first objective lens 8 to apply a given magnetic field to the sample position.

In particular, the controller 22 receives information about the amount of magnetic field and about the polarity from the manual control portion 26 and controls the excitation current flowing through the coil 8a of the first objective lens 8 and the polarity inverter 14 such that the excitation current of the first objective lens 8 and its polarity achieve the entered amount of magnetic field and polarity, respectively. As a result, a desired magnetic field can be applied to the sample S.

By performing the present processing subroutine after the operation for controlling the first objective lens 8 to produce a magnetic field that cancels out the stray magnetic fields, a desired magnetic field can be applied to the sample S while reducing the effects of the stray magnetic fields.

The transmission electron microscope 100 has the following features. In the transmission electron microscope 100, the controller 22 performs the operation for controlling the second objective lens 10 to image the electron beam transmitted through the sample S, thus forming a TEM image of the sample S. That is, imaging is performed not by the first objective lens 8 but by the second objective lens 10 in the second imaging mode under control of the controller 22. Therefore, the effects of magnetic fields on the sample S can be reduced as compared with the operation in the first imaging mode in which imaging is performed by the first objective lens 8. Accordingly, the transmission electron microscope 100 permits observation of a sample that is susceptible to the effects of magnetic fields without varying the state of the sample.

The transmission electron microscope 100 has the first imaging mode in which imaging is done by the first objective lens 8 and the second imaging mode in which imaging is performed by the second objective lens 10. Therefore, if the sample S to be observed is insusceptible to the effects of magnetic fields, the instrument can be operated in the first imaging mode. If the sample S to be observed is susceptible to the effects of magnetic fields, the instrument can be operated in the second imaging mode. That is, the mode of operation of the transmission electron microscope 100 can be switched according to whether the sample S to be observed is susceptible to the effects of magnetic fields.

The transmission electron microscope 100 performs the operation for controlling the first objective lens 8 according to imaging conditions to produce a magnetic field that cancels out the stray magnetic fields at the sample position where the sample S is placed. Therefore, in the transmission electron microscope 100, the effects of magnetic fields reach the position of the sample through a magnetic circuit formed over the whole transmission electron microscope 100 after being produced from the second objective lens 10, imaging lens system 16, and illumination lens system 4. The stray magnetic fields contain external magnetic fields. That is, the effects of stray magnetic fields can be reduced. Consequently, in the transmission electron microscope 100, the effects of magnetic fields on the sample S can be reduced further.

In the operation of the transmission electron microscope 100 for controlling the first objective lens 8 to produce a magnetic field that cancels out stray magnetic fields at the sample position, the excitation current of the first objective lens 8 is determined using a function indicating a relation between the excitation current of the imaging lens system 16 and the excitation current of the first objective lens 8 for canceling out stray magnetic fields. Therefore, in the transmission electron microscope 100, if the amount of stray magnetic fields at the sample position varies due to a variation in the excitation current of the imaging lens system 16, a magnetic field that cancels out the stray magnetic fields can be produced by the first objective lens 8 according to the variation in the amount of stray magnetic fields.

In the operation of the transmission electron microscope 100 for controlling the first objective lens 8 to produce a magnetic field that cancels out stray magnetic fields at the sample position, the excitation current of the first objective lens 8 is determined using a function indicating a relation between the excitation current of the second objective lens 10 and the excitation current of the first objective lens 8 for canceling out stray magnetic fields. Therefore, in the transmission electron microscope 100, if the amount of stray magnetic fields at the sample position varies due to a variation in the excitation current of the second objective lens 10, a magnetic field that cancels out the stray magnetic fields can be produced by the first objective lens 8 according to the variation in the amount of stray magnetic fields.

The transmission electron microscope 100 includes the magnetic field sensor 20 for detecting magnetic fields. The controller 22 performs an operation for controlling the first objective lens 8 on the basis of the results of a detection performed by the magnetic field sensor 20 to produce a magnetic field that cancels out stray magnetic fields at the sample position. Consequently, in the transmission electron microscope 100, the effects of external magnetic fields (i.e., stray magnetic fields) at the sample position can be reduced.

In the transmission electron microscope 100, the controller 22 finds the excitation current of the first objective lens 8 using a function indicating a relation between the amount of external magnetic fields and an excitation current of the first objective lens 8 for canceling out the stray magnetic fields. Therefore, in the microscope 100, if the amount of stray magnetic fields at the sample position varies due to a variation in the amount of external magnetic fields, a magnetic field that cancels out the stray magnetic fields can be produced by the first objective lens 8 according to the variation in the amount of stray magnetic fields.

The transmission electron microscope 100 includes the polarity inverter 14 for controlling the polarity of the first objective lens 8. Therefore, in the microscope 100, the polarity of the first objective lens 8 can be reversed. Consequently, in the microscope 100, the direction of the magnetic field produced by the first objective lens 8 can be controlled.

In the transmission electron microscope 100, the controller 22 performs an operation for controlling the first objective lens 8 to apply a given magnetic field to the sample position. Therefore, in the microscope 100, a desired magnetic field can be applied to the sample S. In consequence, in the microscope 100, if the sample is a magnetic substance, it can be observed while a desired magnetic field is applied to the sample.

In the transmission electron microscope 100, the operation for applying a given magnetic field to the sample position is performed after the operation for controlling the first objective lens 8 to produce a magnetic field that cancels out stray magnetic fields at the sample position. Therefore, in the microscope 100, a desired magnetic field can be applied to the sample S while reducing the effects of the stray magnetic fields.

In the transmission electron microscope 100, the magnetic eraser 12 erases the residual magnetic field in the first objective lens 8 by supplying a given current to the first objective lens 8. Therefore, in the microscope 100, the effects of the residual magnetic field in the first objective lens 8 can be reduced.

2. Second Embodiment

Figure 7:
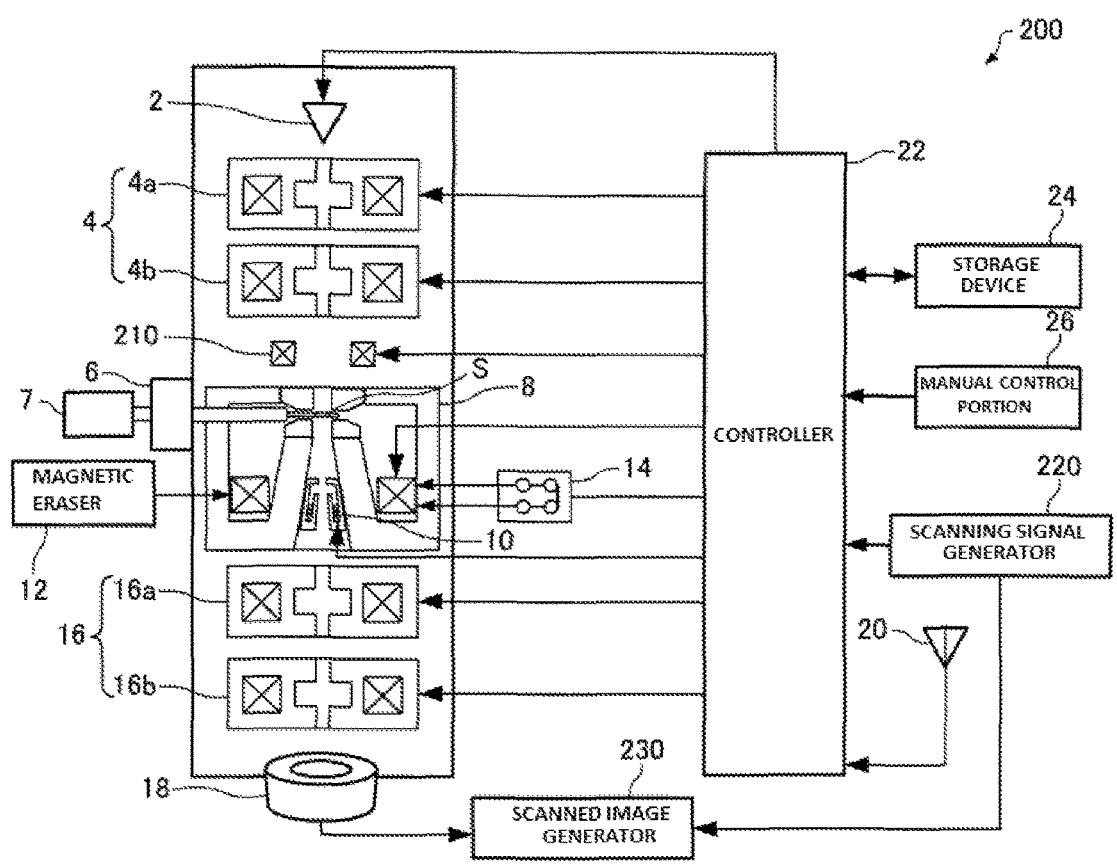
FIG. 7 is a schematic view, partly in block form, of a transmission electron microscope associated with a second embodiment of the present invention, showing the configuration of the microscope.

A transmission electron microscope associated with a second embodiment of the present invention is next described by referring to FIG. 7, which schematically shows the configuration of the transmission electron microscope, generally indicated by reference 200. Those components of the microscope 200 which are similar in function to their respective counterparts of the above-described transmission electron microscope 100 associated with the first embodiment are indicated by the same reference numerals as in the above cited figures and a description thereof is omitted.

In the above-described transmission electron microscope 100, a TEM image is obtained by transmission electron microscopy as shown in FIG. 1. On the other hand, in the transmission electron microscope 200, a TEM image is obtained by scanning transmission electron microscopy as shown in FIG. 7. That is, the transmission electron microscope 200 operates as a scanning transmission electron microscope. Scanning transmission electron microscopy is a technique for obtaining an image by scanning an electron beam over a sample and detecting the intensities of transmitted or diffracted waves emerging from various regions of the sample in synchronism with the scanning of the electron beam.

As shown in FIG. 7, the transmission electron microscope 200 includes scan coils 210, a scanning signal generator 220, and a scanned image generator 230. In the transmission electron microscope 200, the illumination lens system 4 sharply focuses the electron beam emitted from the electron beam source 2 to form an electron beam probe in the second imaging mode.

The scan coils 210 are disposed behind the illumination lens system 4 including the second condenser lens 4b, and are located between the illumination lens system 4 and the first objective lens 8. The scan coils 210 scan the electron beam (electron beam probe) emitted from the illumination lens system 4 over the sample S. The scan coils 210 scan the electron beam on the basis of a scanning signal generated by the scanning signal generator 220.

In the first imaging mode, the imaging lens system 16 focuses a diffraction pattern generated by the first objective lens 8 onto the detector 18. In the second imaging mode, the imaging lens system 16 focuses a diffraction pattern generated by the second objective lens 10 onto the detector 18. The scanning signal generator 220 generates the scanning signal and applies this signal to the scan coils 210.

The scanned image generator 230 images a detection signal from the detector 18, which represents the intensity of the electron beam, in synchronism with the scanning signal, thus producing an STEM image. This STEM image is obtained by synchronizing the detection signal with the scanning signal and shows a distribution of the intensities of the electron beam plotted against sample position. An STEM image is derived by a transmission electron microscope and included in a transmission electron microscope (TEM) image. The scanned image generator 230 displays an STEM image on the display device (not shown).

The scanning signal generator 220 and scanned image generator 230 can operate as computers and perform the above-described processing by executing control programs stored in the storage device 24 by means of a CPU (central processing unit). At least a part of the scanning signal generator 220 and scanned image signal generator 230 may be made of hardware (dedicated circuitry) and perform the above-described processing.

2.2. Operation of Transmission Electron Microscope

The operation of the transmission electron microscope 200 associated with the second embodiment is next described.

2.2.1. Operation for Switching Mode of Operation from First Imaging Mode to Second Imaging Mode An operation for switching the mode of operation from the first imaging mode to the second imaging mode is described by referring to FIG. 8, which is a flowchart illustrating one example of subroutine performed by the transmission electron microscope 200 when the mode of operation is switched from the first to second imaging mode.

In the first imaging mode, the first objective lens 8 is turned on. An electron beam probe is generated over the sample S and used through the use of the magnetic field of the first objective lens 8 located above the sample S. When the user manipulates the manual control portion 26 to switch the mode of operation to the second imaging mode, the manual control portion 26 sends a mode switching signal to the controller 22. In response to this signal, the controller 22 turns off the first objective lens 8, reducing the excitation current of the lens 8 to zero (step S500). At this time, the final magnification is set to a prescribed value. The excitation current of the second objective lens 10 is set to a prescribed value.

Then, the magnetic eraser 12 supplies a given current to the coil 8a of the first objective lens 8 to erase the residual magnetic field in the objective lens 8 (step S502). In the present step, the magnetic eraser 12 sets the amount of magnetic field at the sample position to 0 mT under conditions where the final magnification and the excitation current of the second objective lens 10 are their respective prescribed values.

Then, the user holds the sample S to the sample holder 7 and loads the holder 7 on the sample stage 6. The sample S is inserted between the upper polepiece 8c-1 and the lower polepiece 8c-2 of the first objective lens 8 (step S504). The controller 22 then controls the illumination lens system 4 to form an electron beam probe over the sample S out of the electron beam produced by the electron beam source 2 (step S506). At this time, the electron beam probe is formed using only the illumination lens system 4.

The controller 22 then controls the second objective lens 10 to bring a diffraction pattern from the sample S into focus at the object plane of the imaging lens system 16 (step S508). The controller 22 obtains the set data about the second objective lens 10 stored in the storage device 24 and supplies a given excitation current to the second objective lens 10. At this time, the excitation current of the second objective lens 10 varies and so the amount of stray magnetic fields at the sample position also varies. Therefore, the controller 22 performs an operation for controlling the first objective lens 8 to produce a magnetic field that cancels out the stray magnetic fields at the sample position (steps S510 and S512). In particular, the controller 22 finds the excitation current of the first objective lens 8 from information about the excitation current of the second objective lens 10, using the function stored in the storage device 24 and indicating the relation between the excitation current of the second objective lens 10 and the excitation current of the first objective lens 8 for canceling out the stray magnetic fields at the sample position (step S510). Then, the controller 22 supplies an excitation current corresponding to the found excitation current of the first objective lens 8 to the coil 8a of the first objective lens 8 (step S512). Consequently, the first objective lens 8 produces a magnetic field that cancels out the stray magnetic fields.

The controller 22 then modifies the camera length (step S514). The controller 22 reads data that have been set for the imaging lens system 16 from the storage device 24 and supplies a given excitation current to the imaging lens system 16. Consequently, the imaging lens system 16 focuses a diffraction pattern over the detector 18 with the set camera length. At this time, the excitation current of the imaging lens system 16 varies and, concomitantly, the amount of stray magnetic fields at the sample position varies.

Therefore, the controller 22 performs an operation for controlling the first objective lens 8 to produce a magnetic field that cancels out the stray magnetic fields at the sample position (steps S516 and S518). In particular, the controller 22 finds the excitation current of the first objective lens 8 from information about the excitation current of the imaging lens system 16, using the function stored in the storage device 24 and indicating the relation between the excitation current of the imaging lens system 16 and the excitation current of the first objective lens 8 for canceling out the stray magnetic fields at the sample position (step S516). Then, the controller 22 supplies an excitation current corresponding to the found excitation current of the first objective lens 8 to the coil 8a of the first objective lens 8 (step S518). Consequently, the first objective lens 8 produces a magnetic field that cancels out the stray magnetic fields. The controller 22 ends the present processing subroutine.

Figure 9:
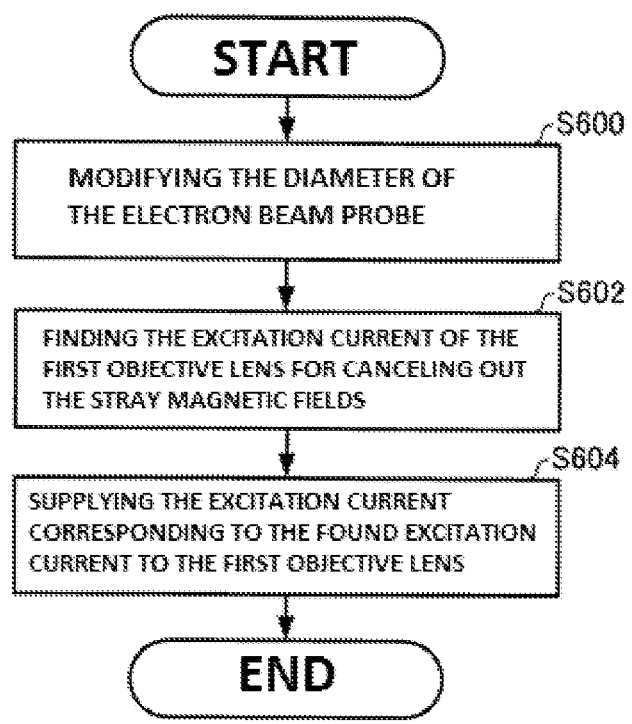
FIG. 9 is a flowchart illustrating one example of subroutine performed by the microscope shown in FIG. 7 when, the diameter of the electron beam probe is varied in the second imaging mode.

2.2.2. Operation Performed when the Diameter of the Electron Beam Probe is Modified The operation of the transmission electron microscope 200 performed when the final magnification is modified in the second imaging mode is next described by referring to FIG. 9, which is a flowchart illustrating one example of subroutine performed by the microscope 200 when the diameter of the electron beam probe is varied in the second imaging mode.

Figure 8:
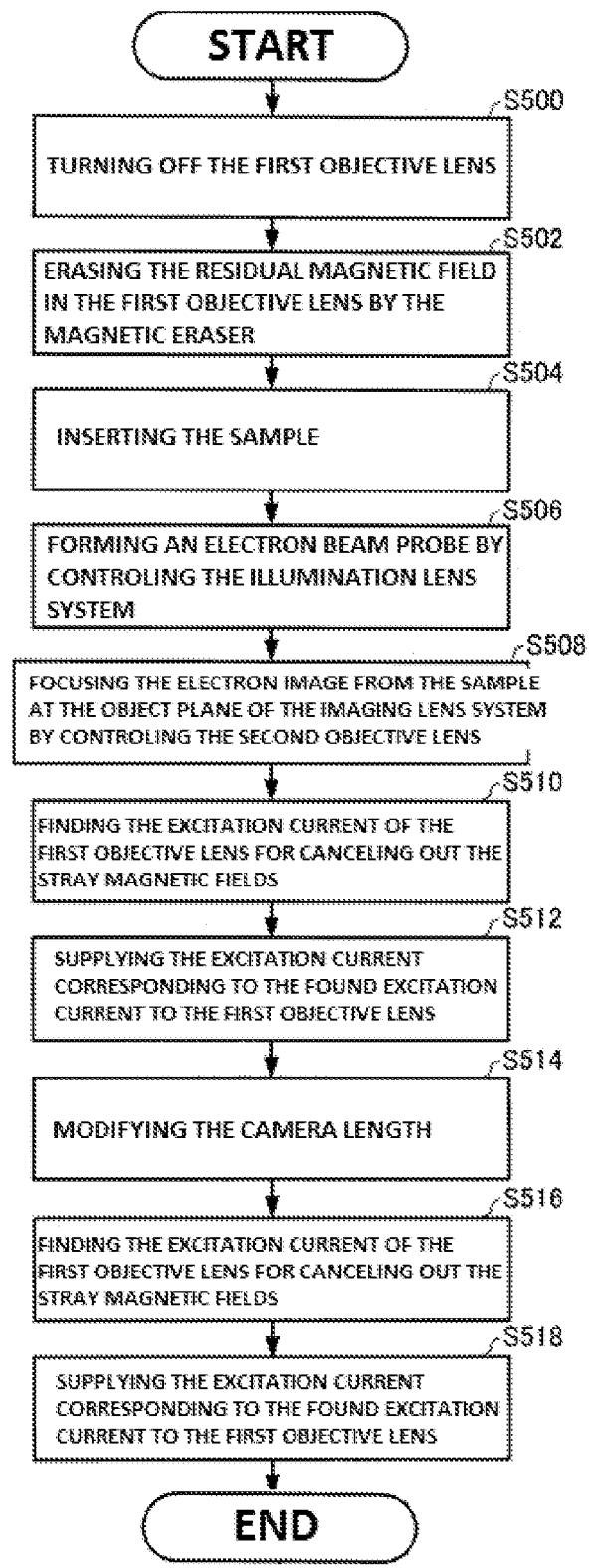
FIG. 8 is a flowchart illustrating one example of subroutine performed by the transmission electron microscope shown in FIG. 7 when the mode of operation is switched from a first imaging mode to a second imaging mode.

The steps S500-S518 illustrated in FIG. 8 are performed and the mode of operation is switched to the second imaging mode. Then, if the user manipulates the manual control portion 26 to enter a desired diameter of the electron beam probe, the manual control portion 26 sends information about the diameter of the electron beam probe to the controller 22. In response to this, the controller 22 starts a processing subroutine.

First, in response to the information about the diameter of the electron beam probe, the controller 22 performs an operation for modifying the diameter of the electron beam probe (step S600). In particular, in response to the information about the diameter of the electron beam probe, the controller 22 reads data, which have been set for the illumination lens system 4 having the first condenser lens 4a and the second condenser lens 4b, from the storage device 24 and modifies the excitation current of the illumination lens system 4 to a value corresponding to the diameter of the electron beam probe. This results in a variation in the excitation current of the illumination lens system 4. As a result, the amount of stray magnetic fields at the sample position varies.

For this purpose, the controller 22 performs an operation for controlling the first objective lens 8 to produce a magnetic field that cancels out the stray magnetic fields at the sample position (steps S602 and S604). In particular, in response to information about the diameter of the electron beam probe from the manual control portion 26, i.e., information about the excitation current of the illumination lens system 4, the controller 22 determines the excitation current of the first objective lens 8 from the information about the excitation current of the illumination lens system 4, using a function stored in the storage device 24 and indicating a relation between excitation currents of the illumination lens system 4 and excitation currents of the first objective lens 8 for canceling out stray magnetic fields at the sample position (step S602).

Then, the controller 22 supplies an excitation current corresponding to the calculated excitation current of the first objective lens 8 to the coil 8a of the first objective lens 8 (step S604). The first objective lens 8 produces a magnetic field that cancels out the stray magnetic fields. The controller 22 terminates the present processing subroutine.

The operation for modifying the diameter of the electron beam probe has been described so far. An operation for modifying the amount of current of the electron beam is performed by modifying the excitation current of the illumination lens system 4 in the same way as in the operation for modifying the diameter of the electron beam probe. Therefore, in the transmission electron microscope 200, the operation for modifying the amount of current of the electron beam is performed in the same way as in the above-described operation for modifying the diameter of the electron beam probe.

2.2.3. Other Processing Operations

The operation of the transmission electron microscope 200 performed when external magnetic fields are detected is similar to the above-described operation under heading "1.2.4." performed when external magnetic fields are detected and so a description thereof is omitted. The operation of the transmission electron microscope 200 performed when a desired magnetic field is applied to a sample is similar to the above-described operation under heading "1.2.5." performed when a desired magnetic field is applied to a sample and a description thereof is omitted.

The transmission electron microscope 200 has the following features. The microscope 200 includes the scanning signal generator 220 for generating a scanning signal and the scan coils 210 for scanning the electron beam over the sample S on the basis of the scanning signal. Therefore, the transmission electron microscope 200 can create scanning transmission electron microscope images.

The transmission electron microscope 200 is further operative to perform an operation for controlling the first objective lens 8 according to imaging conditions under control of the controller 22 to produce a magnetic field that cancels out stray magnetic fields at a position where the sample S is placed, in the same way as in the above-described transmission electron microscope 100. Consequently, the microscope 200 can reduce the effects of stray magnetic fields. Thus, the transmission electron microscope 200 can provide scanning transmission electron microscope images while reducing the effects of stray magnetic fields.

The present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

Having thus described my invention with the detail and particularity required by the Patent Laws, what is desired protected by Letters Patent is set forth in the following claims.

The invention claimed is:

1. A transmission electron microscope comprising:
    an electron beam source producing an electron beam;
    an illumination lens system for causing the electron beam from the electron beam source to impinge on a sample;
    a sample stage for holding the sample thereon;
    a first objective lens having an upper polepiece and a lower polepiece located on opposite sides of the sample, the upper and lower polepieces cooperating to produce a magnetic field;
    a second objective lens disposed behind the first objective lens;
    an imaging lens system disposed behind the second objective lens; and
    a controller for controlling the first objective lens and the second objective lens,
    wherein the controller is configured or programmed to perform an operation for controlling the second objective lens to construct a transmission electron microscope image of the sample from the electron beam transmitted through the sample, and
    wherein the controller is further configured or programmed to perform an operation for controlling the first objective lens according to imaging conditions to produce a magnetic field that cancels out stray magnetic fields at a position where the sample is placed, and
    wherein, during said operation for producing a magnetic field that cancels out said stray magnetic fields, the excitation current of said first objective lens is found, using a function indicating a relation between the excitation current of said imaging lens system and the excitation current of said first objective lens for canceling out the stray magnetic fields.

2. A transmission electron microscope comprising:
    an electron beam source producing an electron beam;

an illumination lens system for causing the electron beam from the electron beam source to impinge on a sample;
a sample stage for holding the sample thereon;
a first objective lens having an upper polepiece and a lower polepiece located on opposite sides of the sample, the upper and lower polepieces cooperating to produce a magnetic field;
a second objective lens disposed behind the first objective lens;
an imaging lens system disposed behind the second objective lens; and
a controller for controlling the first objective lens and the second objective lens,
wherein the controller is configured or programmed to perform an operation for controlling the second objective lens to construct a transmission electron microscope image of the sample from the electron beam transmitted through the sample, and
wherein the controller is further configured or programmed to perform an operation for controlling the first objective lens according to imaging conditions to produce a magnetic field that cancels out stray magnetic fields at a position where the sample is placed, and
wherein, during said operation for producing a magnetic field that cancels out said stray magnetic fields, the excitation current of said first objective lens is found, using a function indicating a relation between the excitation current of said second objective lens and the excitation current of the first objective lens for canceling out the stray magnetic fields.

3. A transmission electron microscope comprising:
an electron beam source producing an electron beam;
an illumination lens system for causing the electron beam from the electron beam source to impinge on a sample;
a sample stage for holding the sample thereon;
a first objective lens having an upper polepiece and a lower polepiece located on opposite sides of the sample, the upper and lower polepieces cooperating to produce a magnetic field;
a second objective lens disposed behind the first objective lens;
an imaging lens system disposed behind the second objective lens; and
a controller for controlling the first objective lens and the second objective lens,
wherein the controller is configured or programmed to perform an operation for controlling the second objective lens to construct a transmission electron microscope image of the sample from the electron beam transmitted through the sample, and
wherein the controller is further configured or programmed to perform an operation for controlling the first objective lens according to imaging conditions to produce a magnetic field that cancels out stray magnetic fields at a position where the sample is placed, and
wherein, during said operation for producing a magnetic field that cancels out said stray magnetic fields, the excitation current of said first objective lens is found, using a function indicating a relation between the excitation current of said illumination lens system and the excitation current of said first objective lens for canceling out the stray magnetic fields.

4. A transmission electron microscope comprising:
an electron beam source producing an electron beam;
an illumination lens system for causing the electron beam from the electron beam source to impinge on a sample;
a sample stage for holding the sample thereon;
a first objective lens having an upper polepiece and a lower polepiece located on opposite sides of the sample, the upper and lower polepieces cooperating to produce a magnetic field;
a second objective lens disposed behind the first objective lens;
an imaging lens system disposed behind the second objective lens; and
a controller for controlling the first objective lens and the second objective lens,
wherein the controller is configured or programmed to perform an operation for controlling the second objective lens to construct a transmission electron microscope image of the sample from the electron beam transmitted through the sample, and
wherein the controller is further configured or programmed to perform an operation for controlling the first objective lens according to imaging conditions to produce a magnetic field that cancels out stray magnetic fields at a position where the sample is placed; and
further including a magnetic field sensor for detecting external magnetic fields, and wherein said controller is configured or programmed to perform an operation for controlling said first objective lens on the basis of results of a detection performed by the magnetic field sensor to produce a magnetic field that cancels out the stray magnetic fields.

5. The transmission electron microscope as set forth in claim 4, wherein said controller finds the excitation current of said first objective lens, using a function indicating a relation between the amount of the external magnetic fields and the excitation current of the first objective lens for canceling out said stray magnetic fields.

* * * * *